(12) United States Patent
Bailey et al.

(10) Patent No.: US 7,679,419 B2
(45) Date of Patent: Mar. 16, 2010

(54) LEVEL SHIFTER DEVICE WITH WRITE ASSISTANCE AND METHOD THEREOF

(75) Inventors: Daniel W. Bailey, Austin, TX (US); Robert Kaye, Austin, TX (US); Julian Selvaraj, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 14 days.

(21) Appl. No.: 11/925,025

(22) Filed: Oct. 26, 2007

(65) Prior Publication Data

US 2009/0108903 A1    Apr. 30, 2009

(51) Int. Cl.
*H03L 5/00* (2006.01)

(52) U.S. Cl. .............................. 327/333; 326/80; 326/81
(58) Field of Classification Search .................. 327/333; 326/80, 81
See application file for complete search history.

(56) References Cited

U.S. PATENT DOCUMENTS

| 6,522,168 | B2* | 2/2003 | Adduci et al. ................. 326/81 |
| 6,919,752 | B2* | 7/2005 | Lim ............................ 327/333 |
| 6,920,570 | B2* | 7/2005 | Fujimoto et al. ............. 713/300 |
| 6,930,518 | B2* | 8/2005 | Kim et al. .................... 327/112 |
| 7,061,299 | B2* | 6/2006 | Khan et al. ................... 327/333 |
| 7,368,970 | B2* | 5/2008 | Lin et al. ..................... 327/333 |
| 7,501,856 | B2* | 3/2009 | Huang .......................... 326/81 |

* cited by examiner

*Primary Examiner*—Kenneth B. Wells

(57) ABSTRACT

A first transistor of a level shifter provides conductivity between a reference voltage and a node of the level shifter to hold a state of the level shifter output. When an input signal of the level shifter switches, additional transistors assist in reducing the conductivity of the first transistor. This enhances the ability of the level shifter to change the state of the output in response to the change in the input signal, thereby improving the writeability of the level shifter.

18 Claims, 2 Drawing Sheets

LEVEL SHIFTER DEVICE WITH WRITE ASSISTANCE AND METHOD THEREOF

FIELD OF THE DISCLOSURE

The present disclosure relates to electronic devices and more particularly to level shifters for electronic devices.

BACKGROUND

Logic modules of electronic devices, such as integrated circuit devices, typically employ a reference voltage that determines the high-level voltage representing a logic level at the module. When logic modules that have different reference voltages need to communicate with each other, a level shifter can provide an interface between the modules having different voltage references. The use of a level shifter allows a module having a lower voltage reference, referred to as a low-reference module, to interface with a module having a higher voltage reference, referred to as a high-reference module. The level shifter translates the lower voltage signal from the low-reference module to a higher voltage signal having a magnitude sufficient to represent the appropriate logic state at the high reference module. The level shifter can also translate signals from the high reference module to signals representing the appropriate logic state at the low-voltage module.

An exemplary prior art level shifter 100 is illustrated in FIG. 1. As illustrated, the level shifter 100 includes p-type transistors 102 and 104 and n-type transistors 106 and 108. The level shifter 100 is being driven by complementary input signals $V_{IN}$ and $V_{INBAR}$ of the low-reference module, where both of the complementary signals are at a voltage $V^{DDL}$, which represents a high-level logic voltage reference that is lower than the high-level logic voltage reference, $V_{DDH}$, of the high-reference module. However, the level shifter 100 can be unreliable when the input $V_{IN}$ transitions from one logic state to another. For example, as the input $V_{IN}$ transitions both the transistor 102 and the transistor 106 can be conductive simultaneously, and can remain so until the voltage at the shared node between them becomes low enough so that the transistor 104 becomes conductive. However, if the transistor 106 is not large enough, relative to the size of transistor 102, the signal $V_{OUT}$ may not transition to the desired high-level logic state in response to the logic state of the low reference module transitioning. Thus, the input signal $V_{IN}$ will not be appropriately translated at the high-reference module. Accordingly, there is a need for an improved level shifter device.

BRIEF DESCRIPTION OF THE DRAWINGS

The present disclosure may be better understood, and its numerous features and advantages made apparent to those skilled in the art by referencing the accompanying drawings.

DETAILED DESCRIPTION

A level shifter device is disclosed. A first transistor of the level shifter provides conductivity between a reference voltage and a node of the level shifter to hold a state of the level shifter output. When an input signal of the level shifter switches, additional transistors assist in reducing the conductivity of the first transistor. This enhances the ability of the level shifter to change the state of the output in response to the change in the input signal, thereby improving the writeability of the level shifter.

Figure 2:
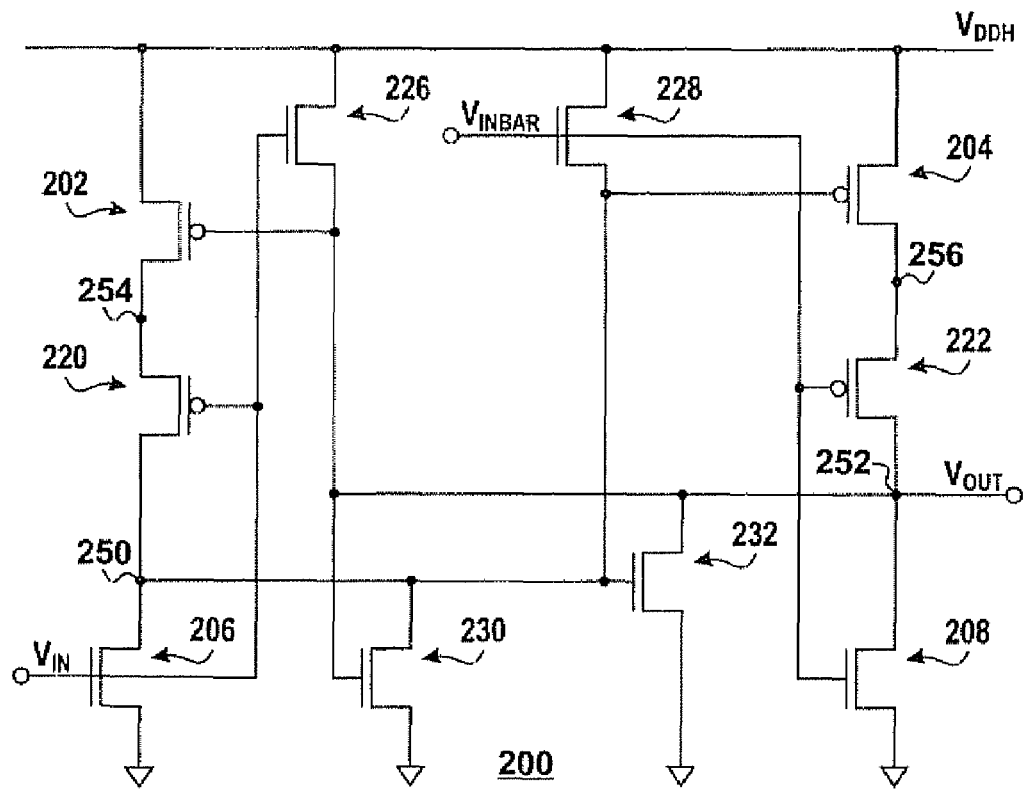
FIG. 2 is a circuit diagram of a particular embodiment of a level shifter device according to one aspect of the present disclosure.

Referring to FIG. 2, a particular embodiment of a level shifter device 200 is illustrated. The level shifter device 200 includes p-type transistors 202, 204, 220, and 222, and n-type transistors 206, 208, 230, and 232. The transistor 202 includes a first current electrode connected to a voltage reference, labeled $V_{DDH}$, a second current electrode connected to a node 254, and a control electrode connected to a node 252. The transistor 220 includes a first current electrode connected to node 254, a second current electrode connected a node 250, and a control electrode configured to receive an input signal labeled $V_{IN}$. The transistor 206 includes a first current electrode connected to the node 250, a second current electrode coupled to a ground voltage reference, and a control electrode configured to receive the signal $V_{IN}$.

The transistor 204 includes a first current electrode connected to the $V_{DDH}$ voltage reference, a second current electrode connected to a node 256, and a control electrode connected to the node 250. The transistor 222 includes a first current electrode connected to the node 256, a second current electrode connected to the node 252, and a control electrode configured to receive an input signal labeled $V_{INBAR}$. The transistor 208 includes a first current electrode connected to the node 252, a second current electrode connected to the ground voltage reference, and a control electrode configured to receive the signal $V_{INBAR}$.

The transistor 226 includes a first current electrode connected to the node 252, a second current electrode connected to the $V_{DDH}$ voltage reference, and a control electrode configured to receive the signal $V_{IN}$. The transistor 228 includes a first current electrode connected to the node 252, a second current electrode connected to the $V_{DDH}$ voltage reference, and a control electrode configured to receive the signal $V_{INBAR}$. The transistor 230 includes a first current electrode connected to the node 250, a second current electrode connected to the ground voltage reference, and a control electrode connected to the node 252. The transistor 232 includes a first current electrode connected to the node 252, a second current electrode connected to the ground voltage reference, and a control electrode connected to the node 250. The node 252 provides an output signal, labeled $V_{OUT}$.

In operation, the level shifter device 200 receives the input signal $V_{IN}$ and its complement $V_{INBAR}$ from a low-reference module and uses the signals to produce the output signal $V_{OUT}$ for a high-reference module. In the illustrated embodiment, the signal $V_{OUT}$ has a higher high-level voltage magnitude than the high-level voltage magnitude of the signal $V_{IN}$. In a particular embodiment, the specified high-level voltage magnitude of the signal $V_{IN}$ is substantially less than the voltage reference $V_{DDH}$.

To illustrate operation of the level shifter device 200, it is assumed for purposes of discussion that the level shifter device 200 is in a steady state of operation with the magnitude of the signal $V_{IN}$ at a low-level voltage, such as ground, that represents a logic state. The signal $V_{INBAR}$ is a complement of the signal $V_{IN}$ and therefore is at a high-level voltage representing a complementary logic state of the low-reference module. A high-level voltage at the control electrode of n-type transistor 208 causes this transistor to become more conductive, thereby allowing the node 252, and the signal $V_{OUT}$, to transition towards a low-level voltage, such as ground. Transistor 202 becomes more conductive as node 252 transitions towards the low-level voltage, which allows node 254 to transition to a voltage level at just below the voltage $V_{DDH}$. Transistor 220 is also conductive due to the low-level voltage of the signal $V_{IN}$. Accordingly, the voltage at the node 250 is also allowed to transition to near the voltage $V_{DDH}$.

When the signal $V_{IN}$ switches to a magnitude representing a high-level voltage of the low reference module, and the signal $V_{INBAR}$ becomes a low-level voltage, such as ground, the transistor 206 becomes more conductive, thereby pulling the node 250 towards the ground voltage reference. Further, the signal $V_{IN}$ causes the transistor 220 to become less conductive, thereby reducing the conductivity of the path between the node 250 and the voltage reference $V_{DDH}$. The high-level voltage of the signal $V_{IN}$ causes the transistor 226 to become conductive, thereby applying a voltage near the magnitude of $V_{DDH}$ to the control electrode of the transistor 202. This also forces the transistor 202 to become less conductive.

The reduced conductivity between the reference voltage $V_{DDH}$ and the node 250, through transistors 202 and 220, assists the transistor 206 in pulling the node 250 toward ground. This causes the transistor 204 to become more conductive, thereby allowing a voltage near $V_{DDH}$ to be obtained at the node 256. Further, the low-level voltage of the signal $V_{INBAR}$ causes the transistor 222 to become more conductive, thereby increasing the voltage at the node 252 and placing the signal $V_{OUT}$ at a magnitude sufficiently close to a high-level voltage that it represents a logic level at the high-reference module. Accordingly, the logic state of the signal $V_{OUT}$ corresponds to the logic state of the signal $V_{IN}$.

In a particular embodiment, as the level shifter 200 reaches a steady state with the signal $V_{OUT}$ representing a logic high, the transistor 226 can become non-conductive. However, at this point the transistors 204 and 222 have become sufficiently conductive so that the node 252, and the signal $V_{OUT}$, remain at a sufficient magnitude to represent a logic high.

Figure 1:
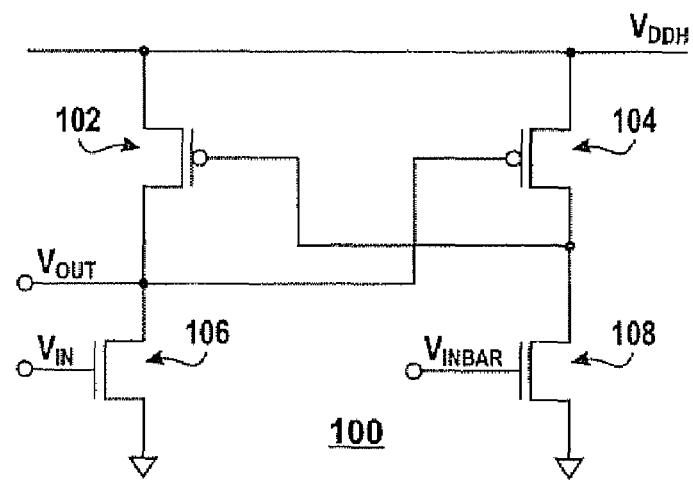
FIG. 1 is a circuit diagram of a prior art level shifter device.

With respect to the level shifter device 100 of FIG. 1, when the input $V_{IN}$ switches from a logic low to a logic high, the level shifter device 100 relies upon the transistor 106 alone to pull the shared node with the transistor 102 to a lower magnitude and thereby switch the logic level of the output signal $V_{OUT}$. If the transistor 106 is too small, or the transistor 102 is too large, this can make it difficult for the transistor 106 to become sufficiently non-conductive for the signal $V_{OUT}$ to reach a magnitude representing a logic low. In contrast, the level shifter 200 uses both the transistors 220 and 226 to assist the transistor 206 in reducing the voltage magnitude at the node 250 when the signal $V_{IN}$ changes to a logic high. This in turn increases the ability of the level shifter 200 to switch the signal $V_{OUT}$ in response to the change in the signal $V_{IN}$ to a logic high level, improving the reliability of the level shifter 200. In addition, the transistors 222 and 228 perform a similar function for the transistor 204 when the $V_{IN}$ signal changes from a logic high to a logic low, thereby further improving the reliability of the level shifter 200.

The transistors 230 and 232 function as keeper transistors, ensuring that if the input signals $V_{IN}$ and $V_{INBAR}$ are both at a ground reference voltage (e.g. when the power supply providing the $V_{DDL}$ voltage is off), the signal $V_{OUT}$ will reach a stable logic level. If transistors 230 and 232 were absent, the risk of undesirable crossover current in downstream circuitry would be increased.

Figure 3:
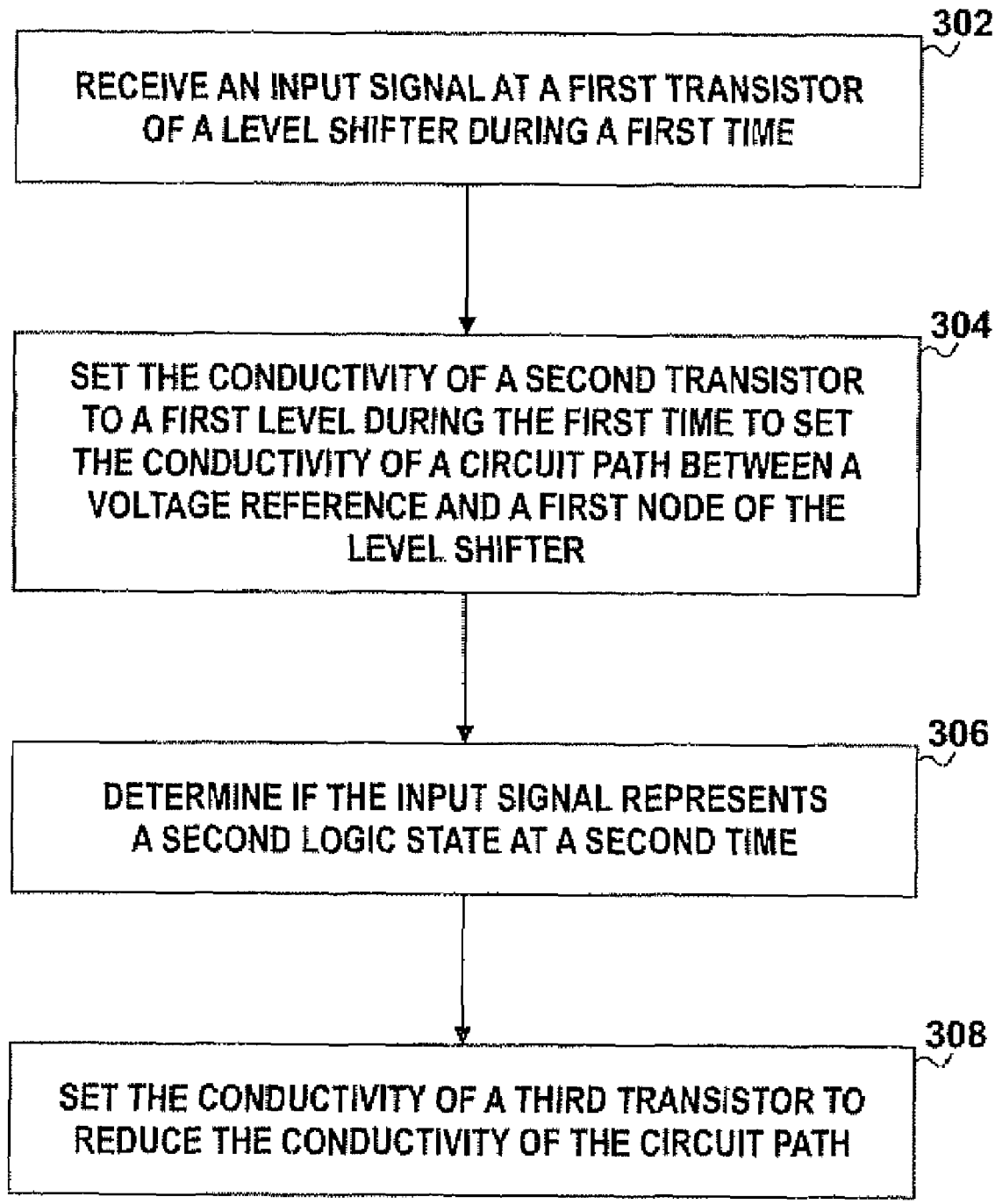
FIG. 3 is a flow diagram of a particular embodiment of a method of level shifting a signal according to one aspect of the present disclosure.

Referring to FIG. 3, a flow diagram of a particular embodiment of a method of level shifting a signal is illustrated. At block 302, an input signal is received at a first transistor of a level shifter. The input signal represents a first logic state during a first time. At block 304, the conductivity of a second transistor is set to a first level during the first time. Further, the conductivity of a first circuit path between a voltage reference and a first node of the level shifter is based on the conductivity of the first transistor.

Moving to block 306, it is determined that the input signal represents a second logic state at a second time. Proceeding to block 308, the conductivity of a third transistor to reduce the conductivity of the first circuit path in response to determining the input signal represents the second logic state.

Other embodiments, uses, and advantages of the disclosure will be apparent to those skilled in the art from consideration of the specification and practice of the disclosure disclosed herein. It will further be appreciated that, although some circuit elements and modules are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof.

What is claimed is:

1. A device, comprising:
   a first transistor of a first conductivity type comprising a first current electrode coupled to a first voltage reference, a second current electrode, and a control electrode;
   a second transistor of the first conductivity type comprising a first current electrode coupled to the second current electrode of the first transistor, a second current electrode, and a control electrode configured to receive a first input signal;
   a third transistor of a second conductivity type comprising a first current electrode coupled to the second current electrode of the second transistor, a second current electrode coupled to a second voltage reference, and a control electrode configured to receive the first input signal;
   a fourth transistor of the second conductivity type comprising a first current electrode coupled to the control electrode of the first transistor, the first current electrode configured to provide an output signal, a second current electrode coupled to the second voltage reference, and a control electrode configured to receive a second input signal different from the output signal;
   a fifth transistor of the first conductivity type comprising a first current electrode coupled to the first voltage reference, a second current electrode coupled to the first current electrode of the fourth transistor, and a control electrode coupled to the first current electrode of the third transistor; and
   a sixth transistor of the first conductivity type coupled between the second current electrode of the fifth transistor and the first current electrode of the fourth transistor, the sixth transistor comprising a first current electrode coupled to the second current electrode of the fifth transistor, a second current electrode coupled to the first current electrode of the fourth transistor and a control electrode configured to receive the second input signal.

2. The device of claim 1, further comprising a seventh transistor of the second conductivity type comprising a first current electrode coupled to the first current electrode of the fourth transistor, a second current electrode coupled to the first voltage reference, and a control electrode configured to receive the first input signal.

3. The device of claim 2, further comprising an eighth transistor of the second conductivity type comprising a first current electrode coupled to the second current electrode of the second transistor, a second current electrode coupled to the first voltage reference, and a control electrode configured to receive the second input signal.

4. The device of claim 3, further comprising a ninth transistor of the second conductivity type comprising a first current electrode coupled to the first current electrode of the seventh transistor, a second current electrode coupled to the second voltage reference, and a control electrode coupled to the first current electrode of the third transistor.

5. The device of claim 4, further comprising a tenth transistor of the second conductivity type comprising a first current electrode coupled to the first current electrode of the eighth transistor, a second current electrode coupled to the ground voltage reference, and a control electrode coupled to the first current electrode of the fourth transistor.

6. The device of claim 1, wherein the first input signal has a maximum specified voltage substantially different than a magnitude of the first voltage reference.

7. The device of claim 1, wherein the first conductivity type is p-type connectivity.

8. The device of claim 7, wherein the second conductivity type is n-type conductivity.

9. A device, comprising:
a first transistor of a first conductivity type comprising a first current electrode coupled to a first voltage reference, a second current electrode, and a control electrode;
a second transistor of the first conductivity type comprising a first current electrode coupled to the second current electrode of the first transistor, and a control electrode configured to receive a first input signal;
a third transistor of a second conductivity type comprising a first current electrode coupled to the second current electrode of the second transistor, a second current electrode coupled to a second voltage reference, and a control electrode configured to receive the first input signal;
a fourth transistor of the second conductivity type comprising a first current electrode configured to provide an output voltage, a second current electrode coupled to the first voltage reference, and a control electrode configured to receive the first input signal; and
a fifth transistor of the second conductivity type comprising a first current electrode coupled to the first current electrode of the fourth transistor, a second current electrode coupled to the second voltage reference, and a control electrode configured to receive a second input signal different from the output signal.

10. The device of claim 9, further comprising:
a sixth transistor of the second conductivity type comprising a first current electrode coupled to the first current electrode of the fourth transistor, a second current electrode coupled to the second voltage reference, and a control electrode coupled to the first current electrode of the third transistor.

11. The device of claim 9, further comprising:
a sixth transistor of the first conductivity type comprising a first current electrode coupled to the first voltage reference, a second current electrode coupled to the first current electrode of the fifth transistor, and a control electrode coupled to the first current electrode of the fourth transistor.

12. The device of claim 11, further comprising:
a seventh transistor of the first conductivity type coupled between the second current electrode of the sixth transistor and the first current electrode of the fifth transistor, the seventh transistor comprising a first current electrode coupled to the second current electrode of the sixth transistor, a second current electrode coupled to the first current electrode of the fifth transistor and a control electrode configured to receive the second input signal.

13. The device of claim 12, further comprising:
an eighth transistor of the second conductivity type comprising a first current electrode coupled to the second current electrode of the second transistor, a second current electrode coupled to the first voltage reference, and a control electrode configured to receive the second input signal.

14. The device of claim 13, further comprising:
a ninth transistor of the second conductivity type comprising a first current electrode coupled to the first current electrode of the eighth transistor, a second current electrode coupled to the ground voltage reference, and a control electrode coupled to the first current electrode of the fifth transistor.

15. The device of claim 9, wherein the first conductivity type is p-type connectivity.

16. The device of claim 15, wherein the second conductivity type is n-type conductivity.

17. The device of claim 9, wherein the first input signal has a maximum specified voltage substantially different than a magnitude of the first voltage reference.

18. A method, comprising:
receiving a first input signal at a first transistor of a level shifter, the input signal representing a first logic state during a first time;
setting the conductivity of a second transistor to a first level during the first time, the conductivity of a first circuit path between a voltage reference and a first node of the level shifter based on the conductivity of the second transistor;
receiving the first input signal at a third transistor of the level shifter;
determining the input signal represents a second logic state at a second time;
setting the conductivity of a fourth transistor based on the conductivity of the third transistor to reduce the conductivity of the first circuit path in response to determining the input signal represents the second logic state;
receiving a second input signal at a fifth transistor of the level shifter; and
in response to determining the first input signal at the second input signal are at a common voltage level, maintaining an output voltage of the level shifter at a first voltage.

* * * * *